Jan. 16, 1968 R. E. EISENHAUER 3,364,365

PULSE AMPLITUDE TO TIME CONVERSION CIRCUIT

Filed June 29, 1965 2 Sheets-Sheet 1

INVENTOR
ROBERT E. EISENHAUER

BY [signature]

ATTORNEY

INVENTOR
ROBERT E. EISENHAUER

BY [signature]
ATTORNEY

United States Patent Office 3,364,365
Patented Jan. 16, 1968

3,364,365
PULSE AMPLITUDE TO TIME CONVERSION CIRCUIT

Robert E. Eisenhauer, Alexandria, Va., assignor to The United States of America as represented by the Secretary of the Navy Filed June 29, 1965, Ser. No. 468,174
13 Claims. (Cl. 307—261)

ABSTRACT OF THE DISCLOSURE

An improved pulse amplitude-to-time conversion circuit of high reliability utilizing a diode coupled in parallel with the base-emitter junction of a transistor wherein the impedance of the diode is greater than the base to emitter impedance of the transistor. The paralleling of the base-emitter circuit of the transistor with the diode of high impedance relative to the impedance of the base-emitter junction of the transistor and the coupling of a storage capacitor between the diode and the base of the transistor allows the output pulse width of the circuit to be independent of the input pulse width and enables the output pulse width to be directly proportional only to the amplitude of the input pulse.

The invention described herein may be manufactured and used by or for the Government of the United States of America for governmental purposes without the payment of any royalties thereon or therefor.

This invention relates to an improved electrical circuit for converting pulse amplitude to pulse width and in particular to a pulse amplitude-to-time conversion circuit wherein the output pulse has a time duration which is linearly proportional to the amplitude of the input pulse and independent of the time duration of the input pulse.

In certain signal processing applications it is more desirable to process time-varying functions rather than amplitude-varying functions since the time-varying functions can be measured with much greater accuracy. Time-varying signals are less susceptible to disturbances such as noise which easily affect amplitude varying signals. Disturbances of amplitude-varying signals have been prevalent in certain satellite telemetry applications. Hence, it has been found necessary to rely upon the accuracy of time-varying signals. In these satellite telemetry operations, a circuit is required for accurately converting amplitude-varying pulses to time-varying pulses which is inexpensive, simple, reliable and utilizes a minimum of components.

The present invention provides a new and improved pulse amplitude-to-time conversion circuit of the highest reliability which employs a minimum of inexpensive components and which has all the advantages of similarly employed converters while operating in a more reliable manner. To attain this the invention provides a circuit for converting the amplitude of an input pulse into a pulse whose time duration is linearly proportional to the amplitude of the input pulse and independent of the time duration of the input pulse. The circuit utilizes a minimum number of components. Only two transistors, one diode, two capacitors and five resistors are employed.

An object of the present invention is to provide a new and improved pulse amplitude-to-time conversion circuit.

Another object is to provide a circuit for converting an amplitude input pulse to a time duration pulse which is particularly suitable for satellite telemetry applications.

A further object is the provision of a pulse amplitude-to-time conversion circuit which is inexpensive, simple, reliable and which utilizes a minimum of components.

Figure 1:
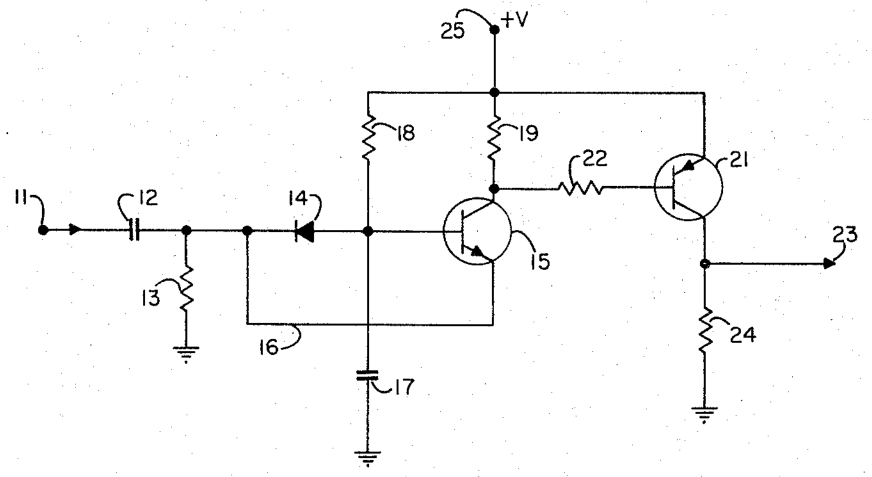
Figure 2:
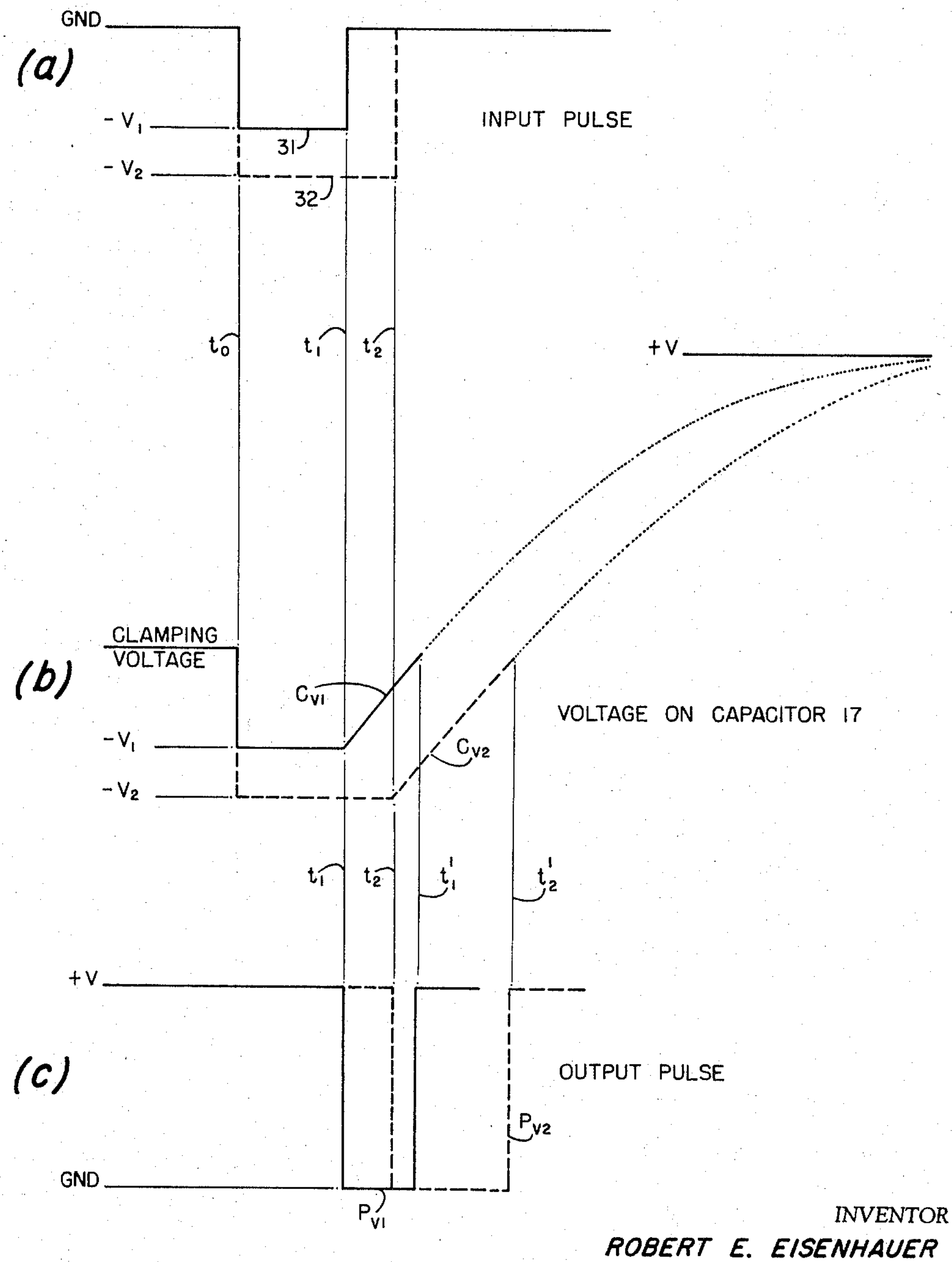

Other objects and many of the attendant advantages of this invention will be readily appreciated as the same becomes better understood by reference to the following detailed description when considered in connection with the accompanying drawings in which like references numerals designate like parts throughout the figures thereof and wherein:

FIG. 1 is a schematic diagram of the pulse amplitude-to-time conversion circuit of this invention; and FIG. 2 illustrates a series of waveform diagrams (*a*) through (*c*) obtained by the circuit of this invention.

Referring now to the drawings there is shown in FIG. 1 a circuit for converting the amplitude of a pulse received at input 11 to a time duration pulse which is linearly proportional to the amplitude of the input pulse and which is independent of the width of input pulse. The input pulse is passed through a coupling capacitor 12 which is directly connected to input 11. A diode 14 has its cathode coupled to the input through capacitor 12 and its anode connected to the base of NPN transistor 15. A direct connection between the cathode of diode 14 and the emitter of transistor 15 is provided by a line 16. A biasing resistor 13 is connected from a point common to the emitter of transistor 15, capacitor 12 and the cathode of diode 14 to ground. A storage capacitor 17 is connected between the base of transistor 15 and ground, while a biasing resistor 18 is connected between the base of transistor 15 and a voltage source 25. Transistor 15 has its collector connected to voltage source 25 through load resistor 19 and to the base of PNP transistor 21 through biasing resistor 22. Transistor 21 has its emitter directly connected to voltage source 25 and has its collector coupled to ground through load resistor 24. An output 23 is provided across resistor 24 at the collector of transistor 21.

In operation, the circuit is biased so that transistor 15 is normally conducting. The conduction may be either full or partial depending on the sensitivity desired. In order to bias transistor 15 into conduction the impedance of diode 14 must be greater than the base to emitter impedance of transistor 15, and bias resistors 13 and 18 must be chosen to insure that transistor 15 has sufficient base drive under all conditions of operation. Silicon-type diodes have been found suitable for this purpose. The paralleling of the base-emitter circuit of transistor 15 with the selected diode 14 allows the output pulse to be independent of input pulse width. Resistors 22 and 24 are selected so that transistor 21 saturates when driven by the collector of transistor 15 when transistor 15 is biased ON.

With the circuit biased as discussed above, transistors 15 and 21 operate as switches and are normally saturated while diode 14 conducts in the forward direction. An input pulse going negative from a ground reference causes diode 14 to increase conduction in the forward direction so that the voltage stored on capacitor 17 drops to the voltage of the input pulse. As diode 14 is driven further into conduction, transistor 15 remains in conduction since the emitter of transistor 15 is connected to the cathode of diode 14. When there is no longer an input pulse, that is, when the input pulse returns to ground, diode 14 becomes reverse biased due to the charge on capacitor 17 which is proportional to the negative voltage amplitude of the input pulse. Transistor 15 is thereby switched off due to the stored charge on capacitor 17 and its collector voltage rises so that transistor 21 is also switched off. The signal at output 23 is normally at the voltage level of source 25 and drops to ground level when transistor 21 turns off, thereby producing a negative-going pulse. The output signal remains at approximately ground level until transistor 15 is returned to its saturated condition. Saturation occurs as capacitor 17 attempts to charge exponentially through resistor 18 toward the voltage of source 25. As the voltage rises to a point slightly above ground (approximately 0.5 volt), transistor 15 is saturated and the voltage of capacitor 17 is clamped to the value of base-emitter voltage drop of transistor 15 plus the voltage drop across resistor 13. When transistor 15 is returned to its saturated condition, transistor 21 is also saturated so that the voltage at output 23 rises to the voltage of source 25 less the collector-emitter voltage drop of transistor 21. As is evident from the above description, the pulse at output 23 remains at ground as long as storage capacitor 17 is charging from a negative value, approximately equal to the amplitude of the input pulse, to the clamping voltage. As is seen from an analysis of FIG. 2(*b*) this time interval increases with increasing amplitudes of the input signal shown in FIG. 2(*a*). It is also seen that the time duration is independent of the pulse width of the input signal and that the output pulse amplitude is always approximately equal to $+V$. Furthermore, the pulse width is dependent upon the value of the time constant of the RC network comprising storage capacitor 17 and charging resistor 18. Hence, either capacitor 17 or resistor 18 can be chosen to give a particular pulse width for a given amplitude.

FIG. 2(*a*) illustrates a pair of typical input pulses 31 (solid) and 32 (dotted) beginning at a time $t_0$ wherein pulse 31 has an amplitude of $-V1$ and pulse 32 has an amplitude of $-V2$ with a greater pulse width than pulse 31. The variation of the charge stored by capacitor 17 when pulses 31 and 32 are applied to the circuit is illustrated in FIG. 2(*b*) wherein waveform $C_{V1}$ (solid) corresponds to the voltage variation due to pulse 31 while waveform $C_{V2}$ (dotted) corresponds to the voltage variation due to pulse 32. Since transistor 15 is normally saturated (before time $t_0$), the capacitor voltage in the absence of an input pulse is normally at the clamping voltage. The waveform obtained at output 23 is illustrated in FIG. 2(*c*) with pulse $P_{V1}$ (solid) indicating the output obtained when pulse 31 is applied and pulse $P_{V2}$ indicating the output pulse obtained when pulse 32 is applied to the circuit.

It is evident from FIG. 2(*b*) that the voltage on capacitor 17 reaches the voltage of the input pulse. When the input pulse 31 returns to its reference level (ground) at a time $t_1$, capacitor 17 begins to charge exponentially toward $+V$, which is the voltage of source 25, but is clamped at the clamping voltage at a time $t_1'$ as shown by waveform $C_{V1}$. The time interval between $t_1$ and $t_1'$ defines the time duration or pulse width of output pulse $P_{V1}$. The portion of the exponential curve between $t_1$ and $t_1'$ is linear so that the width of the output pulse $P_{V1}$ is linearly proportional to the amplitude of pulse 31. Similarly when a pulse 32 of greater amplitude $-V2$ is applied, the voltage of capacitor 17 decreases to a voltage $-V2$ as illustrated by waveform $C_{V2}$ of FIG. 2(*b*), remains at that level as long as the input pulse 32 is at $-V2$, and then begins to charge exponentially toward the voltage of source 25 at a time $t_2$. The voltage is clamped at a time $t_2'$ so that the interval between $t_2$ and $t_2'$ defines the width of output pulse $P_{V2}$. Output pulse $P_{V2}$ is wider than output pulse $P_{V1}$ since a longer time is required for the capacitor to charge from $-V2$ to the clamping voltage than from $-V1$ to the same clamping voltage. The output pulse width is completely independent of input pulse width since the controlling parameter is the voltage amplitude stored on capacitor 17 as indicated by FIG. 2(*b*).

As is evident from the timing diagrams of FIG. 2, a time delay occurs between the leading edge of the input pulse and the leading edge of the output pulse. This time delay may be measured to provide an indication of the pulse width of the input pulse if desired.

In the circuit of FIG. 1, resistors 22 and 24 together with switching PNP transistor 21 comprise an output stage for inverting the pulse at the collector of transistor 15 so that the pulse at output 23 is of the same polarity as the pulse at input 11. As the negative input pulse returns from a negative voltage to ground the collector output of transistor 15 changes from some positive voltage (determined by the bias of transistor 15) and rises to the value of source 25, while the output of transistor 21 changes from a voltage near the source voltage to ground. In addition to the inversion function, the output stage also performs a pulse shaping function by sharpening the pulse output from the collector of transistor 15. Where pulse shaping and inversion are not required, further minimization of the number of components is possible by deleting the output stage comprising PNP transistor 21, resistor 22 and resistor 24. The output of the circuit is then taken from the collector of transistor 15.

Throughout this description reference has been made to transistor saturation with respect to transistor 15. However it should be understood that complete saturation is not a requirement and transistor 15 need not operate as a switch. The circuit may be designed to operate with varying degrees of partial saturation depending upon the desired sensitivity. The desired degree of saturation is readily attained by properly changing the value of the biasing resistors in accordance with conventional design methods.

In summary, this invention provides an improved circuit for converting an input pulse amplitude to a pulse having a time duration which is linearly proportional to the input pulse amplitude and completely independent of the input pulse width. The circuit is inexpensive, reliable, utilizes a minimum of components, and is especially suitable for satellite telemetry applications. It should be obvious to those skilled in the art that this invention also contemplates the substitution of PNP transistors where NPN transistors have been described and the substitution of NPN transistors where PNP transistors have been described. When this is done it is also clear that the polarity of the voltages must be reversed as well as the polarity of the coupling of the diode 14.

Obviously many modifications and variations of the present invention are possible in the light of the above teachings. It is therefore to be understood that within the scope of the appended claims the invention may be practiced otherwise than as specifically described.

What is claimed and desired to be secured by Letters Patent of the United States is:

1. An electrical circuit comprising:
   input means for receiving a pulse,
   a transistor having a first, second and third electrode, wherein said first electrode is coupled to said input means and said third electrode is the output of said circuit,
   storage means coupled to said second electrode,
   means for charging said storage means,
   a unidirectional current device having its cathode coupled to said first electrode and its anode coupled to said second electrode, and
   means for biasing said first, second and third transistor electrodes so that said transistor is normally conducting.

2. The electrical circuit set forth in claim 1 wherein said transistor is an NPN transistor and wherein said first electrode is the emitter, said second electrode is the base and said third electrode is the collector of said transistor.

3. The electrical circuit of claim 2 wherein said unidirectional device is poled to allow positive current flow from said storage means to said input means.

4. The electrical circuit of claim 3 wherein said biasing means includes a first resistor coupled to the cathode of said diode and a second resistor coupled to said anode of said diode.

5. The electrical circuit of claim 4 including a load resistor coupled to the collector of said transistor and wherein said biasing means further includes a voltage source electrically coupled to the base and collector of said transistor through said second resistor and said load resistor, respectively.

6. An electrical circuit for converting an input pulse of a given amplitude to an output pulse having a time duration proportional to the amplitude of said input pulse comprising:

input means, a transistor having a base, emitter and collector wherein said emitter is coupled to said input means, unidirectional current means with its anode coupled to said base and its cathode coupled to said emitter, storage means coupled to said base and responsive to said input pulse amplitude, and means for biasing said emitter, base and collector of said transistor so that said transistor is normally conducting.

7. An electrical circuit as set forth in claim 6 wherein said unidirectional means is a diode poled with its anode coupled to said base and its cathode coupled to said emitter.

8. An electrical circuit as set forth in claim 7 wherein the impedance of said diode is greater than the impedance from base to emitter of said transistor.

9. An electrical circuit comprising:

input means for receiving a pulse having a given amplitude;

a first transistor having a base, emitter and collector, storage means coupled to the base of said first transistor, a diode having its cathode coupled to said input means and to the emitter of said first transistor and its anode coupled to the base of said first transistor, a second transistor having a base, emitter and collector, said base being coupled to the collector of said first transistor, and biasing means coupled to the base, emitter and collector of said first transistor and to the base, emitter and collector of said second transistor, said biasing means including means for charging said storage means, whereby an output voltage pulse is developed at the collector of said second transistor having a time duration which is linearly proportional to the amplitude of said pulse received by said input means.

10. The electrical circuit of claim 9 wherein the impedance of said diode is greater than the base-emitter impedance of said first transistor.

11. The electrical circuit of claim 9 wherein said first transistor is an NPN transistor and said second transistor is a PNP transistor.

12. The electrical circuit of claim 10 wherein said first transistor is an NPN transistor and said second transistor is a PNP transistor.

13. The electrical circuit of claim 12 wherein said biasing means comprises:

a bias voltage source coupled to the emitter of said PNP transistor, a first resistor coupled between said bias voltage source and the base of said first transistor, a second resistor coupled between said cathode of said diode and ground, and a third resistor coupling the collector of said first transistor to the base of said second transistor.

References Cited

UNITED STATES PATENTS

| | | | |
|---|---|---|---|
| 3,098,976 | 7/1963 | Leakey | 328—55 |
| 3,189,844 | 6/1965 | MacKenzie | 307—88.5 X |
| 3,286,200 | 11/1966 | Foulger | 332—1 |

ARTHUR GAUSS, *Primary Examiner.*

J. ZAZWORSKY, *Assistant Examiner.*